(12) United States Patent
Yamada

(10) Patent No.: US 6,594,181 B1
(45) Date of Patent: Jul. 15, 2003

(54) SYSTEM FOR READING A DOUBLE-BIT MEMORY CELL

(75) Inventor: Shigekazu Yamada, Kunitachi (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/143,449

(22) Filed: May 10, 2002

(51) Int. Cl.$^7$ .............................................. G11C 16/06
(52) U.S. Cl. ............................ 365/185.21; 365/185.03; 365/185.2
(58) Field of Search ........................ 365/185.03, 185.2, 365/185.21, 185.24

(56) References Cited

U.S. PATENT DOCUMENTS 5,828,616 A * 10/1998 Bauer et al. ............ 365/185.03
6,292,395 B1 * 9/2001 Lin .......................... 365/185.2
6,438,031 B1 * 8/2002 Fastow .................. 365/185.25
6,459,618 B1 * 10/2002 Wang .................... 365/185.18

* cited by examiner

Primary Examiner—Son Mai
(74) Attorney, Agent, or Firm—Sheppard Mullin Richter & Hampton LLP

(57) ABSTRACT

A system for reducing the recovery time for the second read in the double-bit cell of a semiconductor memory device. For reading the second bit of the double-bit cell, in addition to swapping the source and drain terminals of a core cell, the source and drain terminals of corresponding double-bit reference cells are also swapped. The system includes a circuit that effects the swapping by providing a path to enable reading the cells in the reverse direction for the second bit read. The swapping enables the bits of the core cell to be accurately determined over the life of the device while at the same time reducing the recovery time needed for execution of the read of the second bit of the double-bit cell.

17 Claims, 3 Drawing Sheets

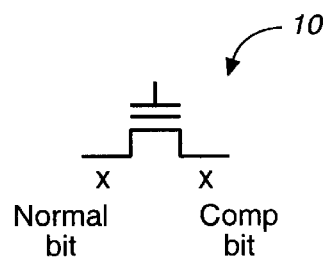
FIG._1
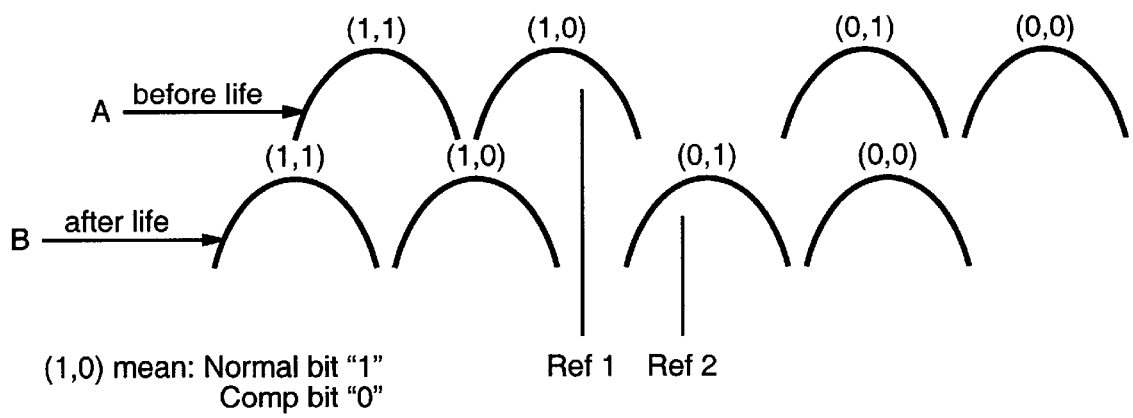
FIG._2A
| Normal Bit | | Comp Bit | | Cell |
|---|---|---|---|---|
| ref 1 | ref 2 | ref 1 | ref 2 | Data |
| 1 | 1 | * | * | 1 |
| 0 | 1 | 0 | 0 | 1 |
| 0 | 1 | 1 | 1 | 0 |
| 0 | 0 | * | * | 0 |
FIG._2B

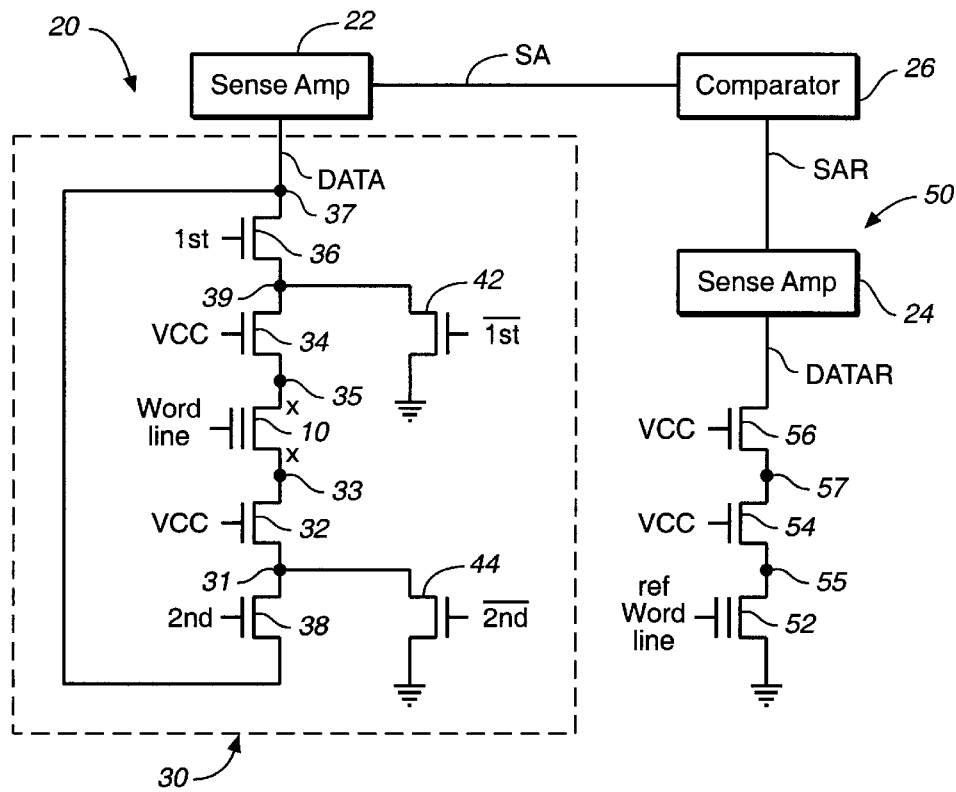
FIG._3
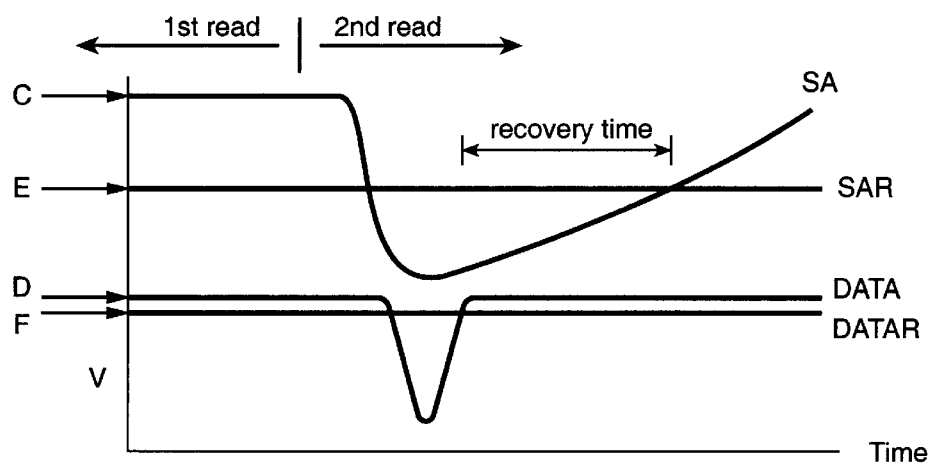
FIG._4

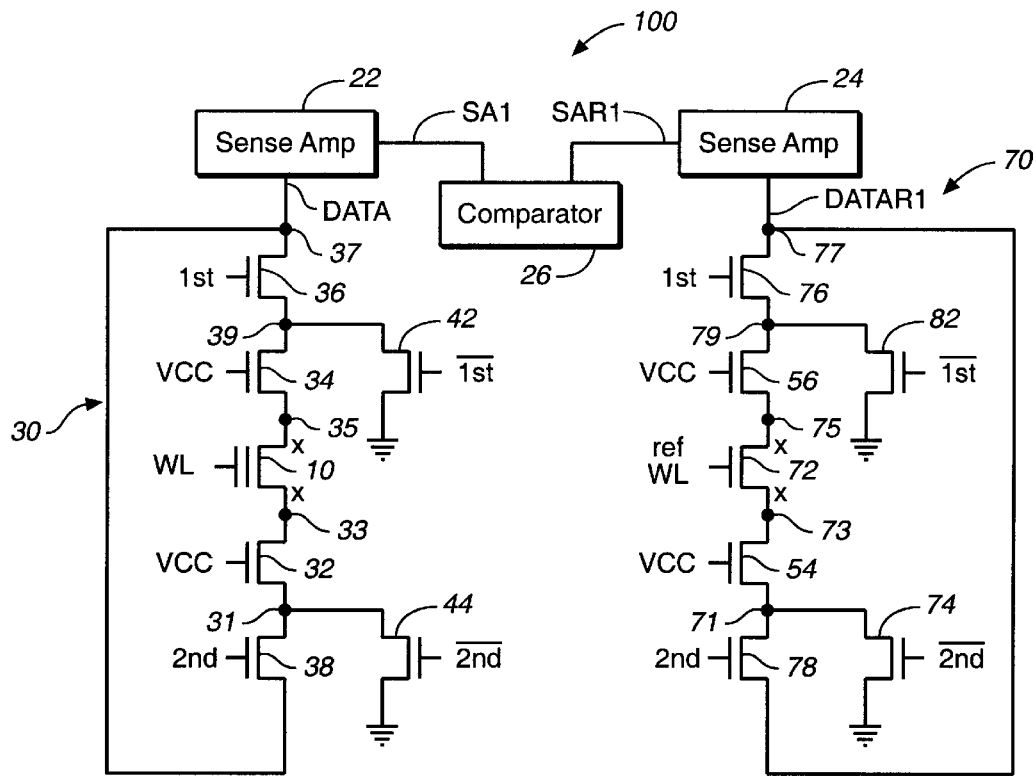
FIG._5
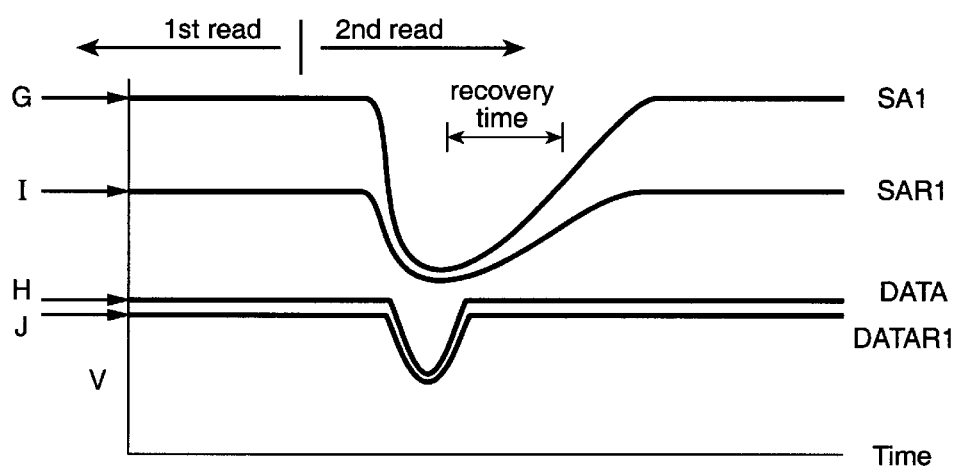
FIG._6

SYSTEM FOR READING A DOUBLE-BIT MEMORY CELL

FIELD OF THE INVENTION

The present invention relates generally to non-volatile semiconductor memory devices, and more particularly, to a system for reading the bits in a double-bit memory cell and associated reference cells.

BACKGROUND OF THE INVENTION

For conventional non-volatile semiconductor devices, such as flash memories, each memory cell stores only one bit of data. For a conventional single bit per cell flash memory architecture, each cell typically includes a metal oxide semiconductor transistor structure having a source, drain, and a channel in a substrate, and a stacked gate structure over a channel. The stacked gate structure typically includes a tunnel oxide formed on the surface of the channel, a floating gate on the tunnel oxide layer, a thin oxide layer over the floating gate, and a control gate overlying the oxide layer. Information is programmed into a flash memory by charging the floating gate for each individual core cell to a predetermined voltage threshold. For a single-bit memory cell, two threshold voltages are predefined such that the data bit is programmed at a threshold that is either a binary "0" or a binary "1".

Modem devices having non-volatile memory are placing ever increasing demands for larger memory in a small profile package. To satisfy this demand for higher density memory, double-bit per cell ("double-bit cell") flash memories have been developed. The double-bit cell refers to a cell that allows the storage of two bits of data into a single memory cell.

FIG. 1 is a schematic diagram of the double-bit core cell structure for the present invention. For each double-bit core cell 10, two bits can be stored and programmed, a first bit identified as the normal bit and a second bit identified as the complementary ("comp") bit. For a non-volatile memory such as flash memory, the integrity of the data must be maintained over the life of the device to avoid data errors that could adversely impact a user. Over the life of a flash memory cell there can be changes in the cell characteristics which can affect the data. One such change for a cell can occur due to the programming of an adjacent cell over time which disturbs the state of nearby cells. Charge loss over the life of the flash memory can also affect the cell characteristics. These changes in the cell characteristics can result in a shifting of the cell threshold voltages. This shifting can affect the state of the memory cells so as to create data errors. As a result, techniques are needed to assure the integrity of the data bits in a cell over time.

FIG. 2a shows two waveforms illustrating an example of the shifting in the distribution of the thresholds for a double-bit cell over time. Since there are two bits in the cell, four threshold distributions are used for the combinations of the two bits. Trace A shows an exemplary state of the voltage threshold distribution for a new memory cell (referred to in FIG. 1 as "before life") that has not undergone any programming or read cycling. As memory cells in the array are cycled over the life of the cell array, charge loss, memory disturb, and other changes occur over time that can affect the device characteristics. The changing device characteristics can shift the threshold distribution into a different state. An example of the shifted state (referred to in FIG. 1 as "after life") is shown in Trace B. For example, in the traces in FIG. 2a, a (1,0) represents a normal bit equal to 1, and a second "complementary" bit equal to 0. Non-volatile memories such as flash memories might be programmed only once and then read intermittently over a long period of time. There is thus a need to determine the data bit values for the double-bit cell accurately for both threshold distributions shown in Trace A and Trace B. In one technique, two reference thresholds (REF1 and REF2) are provided and compared to the core cell threshold in order to determine the cell data. FIG. 2b illustrates how the technique determines the core cell data from the comparison of the reference thresholds to the normal and complementary bits.

As shown in FIG. 2a and the top and bottom data rows in FIG. 2b, if the core cell threshold lies at either of the two extremes of the distribution, (1,1) or (0,0), only a comparison of the normal bit to the two reference thresholds is required in order to determine the data. For this case, since a comparison with the complementary bit is not needed for determining the cell data, the "comp bit" column in FIG. 2b is marked as an "x" representing a "don't care" state. For example, the core cell data should be "0" when the core cell threshold voltage is higher (identified as "0") than the two reference thresholds, as shown in the bottom row in FIG. 2b. Conversely, for a core cell threshold voltage lower than the REF1 and REF2 thresholds, the data should be "1".

The shifting of the distribution thresholds over time from Trace A to Trace B, as illustrated by example in FIG. 2a, presents challenges in determining the data for various core cell thresholds. When a core cell threshold lies in the area between the two reference thresholds, the data cannot be determined solely by comparing the normal bit with the two reference thresholds. This is illustrated by FIG. 2a and FIG. 2b, where for a normal bit of 1 for (1,0) in Trace A, and a normal bit of 0 in (0,1) in Trace B, the comparison to the two reference threshold voltages, REF1 and REF2, yields the same result. In order to attempt to provide for proper determination of the data in the two cases, a technique has been developed that provides for two sequential data reads along with reading the two reference thresholds from two reference cells. If both the normal bit and complementary bit can be read along with the reference cells, then the cell data for either the trace A (before life) or Trace B (after life) distribution can be determined, as explained in more detail below.

The advantage of having the complementary bit in addition to the normal bit is illustrated in FIG. 2b. For this technique, when the core cell threshold lies between two reference thresholds, identified as REF1 and REF2, both the normal bit and the complementary bit are compared to REF1 and REF2. For example, for the case above of a normal bit of 0 in (0,1) in Trace B, for this technique the complementary bit threshold lies under the (1,0) distribution, the opposite of the (0,1) distribution. Thus for a core cell threshold between REF1 and REF2, the complementary bit threshold would not be between the two thresholds and thus can be determined. By illustration, the core cell threshold lies in the area under the (0,1) distribution in Trace B between REF1 and REF2. This case is shown in the next to last row of FIG. 2b. For the normal bit, the core cell threshold is higher than REF1 (shown as "0" in the table) and lower than REF2 ("1"). For Trace B, the complimentary bit corresponding to this core cell threshold lies under the (1,0) threshold. This complementary bit threshold is lower ("1") than both REF1 and REF2. This results in a cell data of 0 as shown in FIG. 2b.

Similarly, as shown in the third row from the bottom of FIG. 2b, the comparison is the same for the normal bit and REF1 and REF2 for the area between REF1 and REF2 under the (1,0) distribution in Trace A. Using the complementary bit results in determining the cell data for that case to be a "1".

For the above technique, by adding a additional comparison of the complementary bit to the reference cells, REF1 and REF 2, the cell data can be accurately determined over the life of the cell, even for the case when the core cell threshold lies between the two reference cell thresholds. For the above method, each bit (normal and complementary) is read along with the two reference cells for the reference thresholds REF1 and REF2. The combination of the data read for the reference cells determines the actual cell data. The system and method to provide for the reading of the complementary bit in order to provide the required comparison, is described in further detail below.

FIG. 3 shows the circuit diagram for the sense circuit architecture corresponding to the method described above. As can be seen from FIG. 3, a sense circuit 20 includes a data circuit 30 coupled to a sense amp 22, and a reference circuit 50 coupled to a reference sense amp 24. The outputs of the sense amp 22 and sense amp 24, on lines ("SA") and ("SAR") respectively are coupled to the input of a comparator 26. Comparator 26 is provided for comparing the output signal SA from the data sense amp 22 with the output signal SAR from the reference sense amp 24 in order to determine the data.

Data circuit 30 includes a core cell 10 having a control gate connected to the word line, a drain connected to a node 35 and a source connected to a node 33. The memory cells in a cell array are typically organized by row and column. The common word line is provided by a control circuit (not shown) for selecting a row for the cell in the array. A VCC signal is also provided by the control circuit for selecting the column of the memory cell to be accessed. The details of the control circuit for the decoding and addressing of an individual cell in a memory array are well known to one of ordinary skill in the art. The present invention is described in further detail for a single core cell 10.

For the reading of the complementary bit, the drain and source of the core cell 10 must be swapped, as compared to the reading of the normal bit. Thus there is one path to the DATA bit line provided for the reading of the normal bit and a different path provided for reading the complementary bit. As shown in FIG. 3, additional transistors are typically provided as pass transistors for providing the two conduction paths to the DATA bit line, as will be described in more detail below.

In the data circuit 30 in FIG. 3, the source terminal of the core cell 10 connects, at node 33, to the drain terminal of a pass transistor 32. Pass transistor 32 has a gate connected to VCC and a source connected to a node 31. A transistor 38 has a drain connected to node 31, a source connected to the input of sense amp 22 at node 37, and a gate connected to a "$2^{nd}$" line. This $2^{nd}$ line is provided by a control circuit (not shown) and provides control for the selection of the path for the reading of the second of the two bits in the double-bit cell (the complementary bit). Thus, if the second bit of core cell 10 is to be read, the gate inputs of the transistors in data circuit 30 will be controlled so as to provide for a connection path from the source terminal of core cell 10 at node 33, through transistors 32 and 38, to node 37 which connects to the DATA bit line at the input to the data sense amp 22. Node 31 is also connected to the drain of a transistor 44. The source of transistor 44 is connected to ground and the gate is connected to a "$2^{nd}$ bar line" as shown in FIG. 3. Transistor 44 provides a path to ground that is needed for the reading of the normal (first) bit.

Node 35, at the drain terminal of core cell 10, connects to a source terminal of a pass transistor 34 having a gate connected to VCC and a drain connected to the source of a transistor 36 at node 39. Transistor 36 has a drain connected to the DATA bit line at the input of sense amp 22 at node 37. The gate for transistor 36 is connected to a "1st" line. This $1^{st}$ line provides control for reading the first of the two bits (the normal bit). Node 39 is also connected to the drain of a transistor 42. The source of transistor 42 is connected to ground and the gate is connected to a "1st bar line". Transistor 42 provides a path to ground for the drain of cell 10 for the reading of the complementary (second) bit. The $1^{st}$ and "$2^{nd}$ bar" signal are thus active for the reading of the normal bit, and the $2^{nd}$ and "$1^{st}$ bar" are active for the reading of the complementary bit. The VCC and word line signals as described above, are set active when core cell 10 is selected.

Reference circuit 50 will now be described with reference to FIG. 3. Although only one reference circuit 50 (e.g. for REF1) and sense amp 24 and comparator 26 is shown if FIG. 3, sense circuit 20 would include an identical circuit (not shown) associated with the second reference cell for the second reference threshold, REF2. Reference circuit 50 includes a reference cell 52 having a control gate connected to the reference word line, a source connected to ground, and a drain connected to a node 55. Two transistors 54, 56 are connected in series between node 55 and the input of the sense amp 24. The gates of transistor 54, 56 are shown connected to VCC. The source of transistor 54 is connected to node 55 at the drain terminal of reference cell 52. The drain of transistor 54 and source of transistor 56 are both connected at node 57. The drain of transistor 56 connects to the input of the sense amp 24 as shown at the reference signal DATAR in FIG. 3.

The operation of the sense circuit 20 will now be described with reference to FIGS. 3 and 4. For the method corresponding to FIG. 3, each bit (normal and complementary) is read along with the two reference cells. The comparisons of the voltages for the bit and reference cells for the two reads determines the actual core cell data. For the circuit in FIG. 3, the normal bit and complementary bit cannot be read at the same time, because the reading of the second (complementary) bit requires the swapping of the source and drain of core cell 10. In order to obtain both data bits in the double-bit cell for circuit 20 there must be two separate reads: one read for the normal bit (and reference cells), and a second read for the complementary bit (and reference cells). Because of the need for two reads, the access time required to complete both reads is critical in determining how fast both bits are read accurately.

A key determining factor in the total read access time is how fast the second (complementary bit) read is completed after the first (normal bit) read. A drawback of the sense circuit 20 and method in FIG. 3, is the bit line undershoot that delays the execution of the second read. FIG. 4 illustrates this undershoot drawback. The voltage traces in FIG. 4 show the voltages over time as the first read is completed and the second read is executed. Trace C in FIG. 4 shows a waveform for the sense amp signal (SA) from FIG. 3 for the output of the data sense amp 22. Trace D is a waveform for the voltage for the corresponding data (DATA) at the bitline. Trace E is a waveform for the voltage for the SAR signal from the reference sense amp 24; and Trace F represents the reference cell data voltage (DATAR) input to the sense amp 24. In operation, when the second bit is to be read, the source and drain are swapped. As a result, the drain of core cell 10 starts to charge and the source begins to be discharged. This transition period causes a huge voltage drop in the bit line (DATA) which becomes a huge voltage drop "undershoot"), in the corresponding sense signal SA in circuit 20 as shown in Trace C in FIG. 4.

As shown in FIG. 4, after this undershoot in SA occurs, there is a significant time interval before the SA signal can return to a desirable level in order to perform the second read. This time interval is the "recovery time" identified in FIG. 4. In operation, the SA signal must recover sufficiently so that there is the required margin between the SA and SAR signals in order for the second read to proceed. This large recovery time is a drawback of the circuit 20 of FIG. 3 since it results in a significant time loss in the total access time to complete the two required reads.

Modern devices increasingly are requiring faster memory access times in order to process the data at a rate that can provide the response that users demand. Access times for a flash memory must be optimized while increasing the density. There is therefore a need for providing optimized memory access times for a double-bit flash memory while maintaining the integrity of the memory data over the life of the memory.

Therefore, it would be desirable to have a system and method for reducing the recovery time for the second read in order to provide faster access time for execution of the two reads for a double-bit memory cell in a nonvolatile memory.

SUMMARY OF THE INVENTION

The present invention provides a system and method for reference cell swapping for reducing the recovery time for the second read for a double-bit cell in a non-volatile memory, such as a flash memory. The reduction in recovery time reduces the overall read time for the two reads substantially compared to other techniques. For the present invention, two consecutive reads are performed with each bit in the double-bit cell being read along with two reference cells. The system includes a circuit to provide for the swapping of the source and drain terminals of both the reference circuit and the data circuit in order to efficiently and correctly read the data. The system of the present invention includes a circuit and method that accounts for changes in the memory cell characteristics over time and thereby eliminates data errors.

In an embodiment of the present invention, an apparatus for providing for reading two data bits and two reference cells. The threshold voltages of each data bit and two reference cells are sensed. The two reference cell threshold voltages are each separately compared to the data bit sensed voltage threshold. A second complementary bit of the double-bit cell is read after a normal bit by swapping the core cell drain and source terminals. In order to substantially reduce recovery time for the second read, the reference cell drain and source are also swapped for the second read such that the sense reference threshold voltage has a drop (undershoot) that occurs due to the swapping, and that this undershoot tracks with a corresponding undershoot for the sensed data threshold voltage. The system of the present invention thereby reduces recovery time for the second read by enabling the sense signal for the data and sense signal for the reference cells to track each other. The tracking of the voltage undershoots that is provided permits the sense data voltage signal to reach the desired level in order to enable the second read to proceed and be executed much faster than for the known systems and methods.

Thus, the system of the present invention achieves fast read access times since the two bits in a double-bit memory cells are read with minimized recovery time between reads while also obtaining the desired accuracy in reading the data values despite characteristic changes of the memory cell over time.

BRIEF DESCRIPTION OF THE DRAWINGS

The aforementioned and related advantages and features of the present invention will become apparent upon review of the following detailed description of the invention, taken in conjunction with the following drawings, where like numerals represent like elements, in which:

FIG. 1 is a schematic diagram of the double-bit core cell structure for the present invention;

FIG. 2a is a timing diagram showing two exemplary waveforms illustrating the shifting in the distribution of the thresholds for a double-bit cell over time;

FIG. 2b is a table showing the use of the complementary bit and reference cells to determine the cell data;

FIG. 3 is a schematic diagram of a sense circuit architecture;

FIG. 4 is a timing diagram showing voltages over time for execution of the read of the second bit;

FIG. 5 is a schematic diagram of an embodiment of the circuit of the present invention; and FIG. 6 is a timing diagram showing voltages over time illustrating the reduced recovery time for the second read for the embodiment of the present invention in FIG. 5.

DETAILED DESCRIPTION

The present invention includes a system for reference cell swapping for reducing the recovery time for the second read in the double-bit cell. The present invention has the advantage of significantly reducing the total access time to execute both reads for a double-bit cell. The present invention has the further advantage of reducing this read time while enabling the data in the double-bit cell to be read accurately over the life of the memory cell, accounting for changes in the cell characteristics over the life of the memory due to disturb, charge loss and other changes.

The present invention will now be described with reference to FIGS. 5 and 6. FIG. 5 is a schematic diagram of an embodiment of the system of the present invention. A sense circuit 100 in FIG. 5 includes a data circuit 30 coupled to a sense amp 22, and a reference circuit 70 coupled to a reference sense amp 24. As in circuit 20 in FIG. 3, in FIG. 5, the outputs of the sense amp 22 and sense amp 24, on lines ("SA1") and ("SAR1") respectively are coupled to the input of a comparator 26. For circuit 100, the data circuit 30 is as described above for FIG. 3.

In contrast to the circuit 20 in FIG. 3, circuit 100 provides for swapping the source and drain terminals of the reference cell in the reference circuit 70, just like the drain and source are swapped for the core cell 10 in the data circuit 30. As a result of swapping the source and drain for both the reference circuit 70 and the data circuit 30 for this system in FIG. 5, the voltage drop during the transition to the second read is applicable to both the data cell and the reference cell, as will be described further below. For the embodiment in FIG. 5, the data circuit 30 and the swapping of the associated core cell 10 drain and source therein are as described above for FIG. 3. The reference cell swapping for the circuit in FIG. 5 will now be described further.

As shown in FIG. 5, reference circuit 70 includes a reference cell 72 having a control gate connected to the reference word line, a drain connected to a node 75, and a source connected to the drain of a pass transistor 54 at node 73. Although only one reference circuit 70 (for a first threshold, e.g. REF1) and sense amp 24 and comparator 26 are shown if FIG. 5, circuit 100 would include an identical circuit (not shown) associated with the second reference cell for the second reference threshold, REF2. Thus, the each data bit can be separately compared two sensed reference thresholds in order to determine the cell data. In the reference circuit 70, two transistors 56 and 76 are connected in series between node 75 and the input of the sense amp 24. The gates of transistor 54, 56 are connected to VCC. Transistors 54 and 78 are connected in series between node 73 and the input of the sense amp 24. The source of transistor 54 is connected to node 71 at the drain of transistor 78. The source of transistor 78 connects to the input of the sense amp 24 at node 77 as shown at the reference signal DATAR1 in FIG. 5. Transistor 78 has a gate connected to a "$2^{nd}$" line. This $2^{nd}$ line is provided by a control circuit (not shown) as described for the data circuit 30 and provides control for the selection of the path for the reading of the second of the two bits in the double-bit reference cell (the reference complementary bit). When active this $2^{nd}$ line provides for the selection of the reference complementary bit by providing a connection path from the source terminal of reference cell 72, through transistors 54 and 78 to node 77. This provides a connection to provide the second reference threshold bit to the DATAR bit line at the input to the data sense amp 24. Node 71 is also connected to the drain of a transistor 74. The source of transistor 74 is connected to ground and the gate is connected to a "$2^{nd}$ bar line". As described, the $1^{st}$ and "$2^{nd}$ bar" signal are thus active for the reading of the normal bit, and the $2^{nd}$ and "$1^{st}$ bar" are active for the reading of the complementary bit. The VCC and reference word line ("WL") signals are set active when core cell 10 is selected. Transistor 74 provides a path to ground for the reading the first (normal) reference threshold.

As shown in FIG. 5, node 77 connects to the DATAR1 bit line at the input to the data sense amp 24. Transistor 76 has a drain connected to node 77. The gate for transistor 76 is connected to a "1st " line. This 1st line provides control for the selection of the first (normal) of the two reference threshold bits. When the $1^{st}$ line is set, the transistor 76 provides a connection to provide a path (through transistor 56) to enable the first (normal) reference threshold bit from reference cell 72 to be sensed at the data sense amp 24 for comparison with the data bits. The source of transistor 76 is connected to the drain of transistor 56 at a node 79. Node 79 is also connected to the drain of a transistor 82. The source of transistor 82 is connected to ground and the gate is connected to a "1st bar line". Transistor 82 provides the connection to ground for the drain of reference cell 72 required for reading the second (complementary) reference threshold.

The operation of the sense circuit 100 will now be further described with reference to FIGS. 5 and 6. For the method corresponding to FIG. 5, each bit (normal and complementary) is read along with the two reference cells. The comparisons of the voltages for the bit and reference cells for the two reads determines the actual core cell data. For the circuit in FIG. 5, the normal bit and complementary bit cannot be read at the same time, because the reading of the second (complementary) bit after the normal bit requires swapping of the source and drain. In order to obtain both data bits in the double-bit cell for circuit 100 there must be two separate reads: one read for the normal bit (and reference cells), and a second read for the complementary bit (and reference cells).

FIG. 6 is a timing diagram showing voltages over time illustrating the reduced recovery time for the second read for the circuit 100 of the present invention in FIG. 5. Trace G in FIG. 6 shows the sense amp signal (SA1) for the circuit in FIG. 5 for the output of the data sense amp 22. Trace H shows the voltage for the corresponding data (DATA1) at the bitline. Trace I is a waveform showing the voltage for the SAR signal from the reference sense amp 24. Trace J shows a waveform for the reference cell data voltage (DATAR) input to the sense amp 24.

For this embodiment shown in FIG. 5, for the second read, in addition to swapping the source and drain of the data cell 10, the source and drain for the reference cell 72 are also swapped. As shown in FIG. 6, during the transition from the first to second read for the reference bits in circuit 70 a huge voltage drop undershoot happens to the reference side. As described above, a similar huge voltage drop undershoot occurs during the transition from the first to second read for the core cell side since the drain and source are swapped for circuit 30. As seen in FIG. 6, the sense signals SA1 and SAR1 both exhibit this undershoot after the first read and track much closer than the respective sense signals SA and SAR in FIG. 4. The recovery time required before the second read can be completed depends on whether there is sufficient margin between the SA1 and SAR1 signals. Once this margin appears, the second read can be completed. As shown in FIG. 6, because SAR1 had the same relative voltage drop as occurs for signal SA1, the margin appears much faster for the circuit 100 in FIG. 5 as compared to the circuit 22 in FIG. 3. Thus, for the embodiment in FIG. 5, the recovery time for the second read is minimized. As shown in FIG. 4, the sense circuit 20 does not provide such tracking which results in increased recovery time and much slower read times for the second read. For the present invention, there will be two reference cells, one reference cell programmed for a first predetermined reference threshold (identified as REF1) and one reference cell programmed for a second predetermined reference threshold (identified as REF2). Each reference cell is a double-bit cell having a normal and complementary bit. In order for the comparisons with the core cell thresholds to be made with either bit, the normal and complementary bit are both programmed within a cell to the same threshold (e.g. threshold REF1 for one cell and threshold REF2 for the second reference cell). As noted, although only one reference circuit 70 (for a first threshold, e.g. REF1) and sense amp 24 and comparator 26 are shown if FIG. 5, circuit 100 includes an identical circuit (not shown) associated with the second reference cell for the second reference threshold, REF2. For the second reference circuit the reference normal and complementary bits must be set to the same predetermined threshold (e.g. REF2). Details regarding the control of addressing and selection of a particular memory cell and a particular bit in a double-bit cell are not shown; such details being known to one of ordinary skill in the art.

This reference cell swapping system in FIG. 5 of the present invention has the advantage of reducing the second read time significantly by providing for better tracking between the reference sense signal SAR1 and the core cell sense signal SA1 during the transition to the second read while accounting for changes in the cell characteristics over time.

While the present invention has been described in connection with exemplary embodiments thereof, those skilled in the art will appreciate that the invention is not limited to the embodiments described, and that modifications of the exemplary embodiments may be made without departing from the spirit and scope of the appended claims. Thus, the foregoing description is to be regarded as illustrative instead of limiting.

What is claimed is:

1. A method of reading a double-bit core cell of a memory device, the double-bit core cell having two bits stored as voltage thresholds therein, the first bit being the normal bit and the second bit being the complementary bit; the memory device having two double-bit reference cells associated with the double-bit core cell, each of the double-bit reference cells having a first and second reference bit stored as a predetermined reference threshold; the method comprising the steps of:

reading the normal bit threshold of the core cell;
reading the first reference bit predetermined threshold of each of the double-bit reference cells;
comparing the core cell normal bit threshold to the first reference bit threshold of each of the two reference cells simultaneously;
reading the complementary bit threshold of the core cell;
reading the second reference bit threshold of each of the double-bit reference cells;
comparing the core cell complementary bit threshold to each of the second reference bit thresholds of each of the two reference cells simultaneously;
wherein based on the comparisons the binary value of the bits of the double-bit core cell are determined.

2. The method of claim 1, wherein the memory device is a non-volatile memory device.

3. The method of claim 2, wherein the memory device is a flash memory.

4. The method of claim 1, wherein the first reference cell bit is a normal bit and the second reference cell bit is a complementary bit.

5. The method of claim 4, wherein the double-bit core cell has a source, drain and gate terminals, and wherein the step of reading the core cell complementary bit threshold includes the step of swapping the source and drain terminals of the double-bit core cell such that the core cell is read in the opposite direction from the reading of the core cell normal bit threshold.

6. The method of claim 5, wherein the step of swapping the source and drain terminals of the double-bit core cell results in a substantial voltage undershoot.

7. The method of claim 6, wherein each of the double-bit reference cells has a source, drain and gate terminals, and the step of reading the reference cell complementary bit threshold includes the step of swapping the source and drain terminals of each of the double-bit reference cells such that each of the reference cells is read in the opposite direction from the reading of the reference cell normal bit threshold of each of the reference cells.

8. The method of claim 7, wherein the step of swapping the source and drain terminals of the reference cells results in a substantial voltage undershoot.

9. The method of claim 8, wherein the substantial voltage undershoot resulting from the swapping of the reference cell drain and source terminals tracks the substantial voltage undershoot resulting from the swapping of the core cell drain and source terminals, such that the recovery time required before the reading of the core cell complementary bit threshold is minimized.

10. A circuit for reading the two bits of a double-bit memory cell such that the access time for the reading of the second bit of a double-bit flash memory cell is minimized; the circuit comprising:

a double bit storage cell having a normal bit and a complementary bit stored therein, each bit being stored as a voltage threshold, first and second double-bit reference cells, each storing two reference bits, the first reference bit being a normal bit and the second reference bit being a complementary bit; the normal and complementary bits of the first reference cell being stored as a first predetermined reference threshold, the normal and complementary bits of the second reference cell being stored as a second predetermined reference threshold;

a sense amplifier circuit for detecting and amplifying the difference between the threshold of each of the data bits of the double-bit storage cell and the first and second predetermined reference thresholds so as to determine the value of the storage cell data bits;

a data circuit comprising a plurality of transistors for providing a connection between the storage cell and the sense amplifier circuit such that the normal bit and complementary bit thresholds are provided to the sense amplifier circuit;

first and second reference circuits, each comprising a plurality of transistors for providing a connection between a corresponding reference cell and the sense amplifier circuit such that each of the two predetermined reference cell thresholds are provided to the sense amplifier circuit; and wherein each of the normal bits and complementary bits of the corresponding storage cell and corresponding reference cells are read sequentially, the reference circuits and data circuit being configured such that each complementary bit is read after the corresponding normal bit is read and in the opposite direction of the reading of the corresponding normal bit;

such that a voltage overshoot occurs between the reading of the storage cell normal bit and storage cell complementary bit, and a corresponding voltage overshoot occurs between the reading of the normal and complementary reference bits of each double-bit reference cell, such that the recovery time for the reading of the storage cell complementary bit is minimized.

11. The circuit of claim 10, wherein the double-bit storage cell and double-bit reference cell each have a source terminal, a drain terminal, and a control gate terminal.

12. The circuit of claim 10, wherein the sense amplifier circuit comprises a plurality of sense amplifiers and a plurality of comparators.

13. The circuit of claim 12, wherein the sense amplifier circuit comprises a first sense amplifier coupled to the data circuit, a second sense amplifier coupled to the first reference circuit and a third sense amplifier coupled to the second reference circuit, a first comparator coupled to the first and second sense amplifiers for comparing the storage cell bit thresholds to the first predetermined reference threshold, and a second comparator coupled to the first and third sense amplifier for comparing the storage cell bit thresholds to the second predetermined reference threshold.

14. The circuit of claim 13, wherein the plurality of transistors of the corresponding first and second reference circuits are oriented to enable the corresponding reference bits to be sensed by the sense amplifier circuit.

15. The circuit of claim 14, wherein the plurality of transistors of the corresponding first and second reference circuits are controlled such that for reading the normal bit of each reference cell a path is provided between the source terminal of the corresponding reference cell and ground and between the drain terminal of the corresponding reference cell and the sense amplifier circuit, and for reading the complementary bit of each reference call a path is provided between the drain terminal of the corresponding reference call and ground and between the source terminal of the corresponding reference cell and the sense amplifier circuit.

16. The circuit of claim 15, wherein a voltage overshoot occurs between the reading of each normal bit and complementary bit of the corresponding storage cell, and a corresponding voltage overshoot occurs between the reading of the normal bit and complementary bits of each double-bit reference cell, such that the recovery time for the reading of the storage cell complementary bit is minimized.

17. The circuit of claim 13 wherein the plurality of transistors of the data circuit provide a path between the source of the storage cell and ground and the drain of the storage cell and the first sense amplifier thereby enabling the reading of the complementary bit of the storage cell.

* * * * *